US010522377B2

United States Patent
Zhang et al.

(10) Patent No.: US 10,522,377 B2
(45) Date of Patent: Dec. 31, 2019

(54) SYSTEM AND METHOD FOR SUBSTRATE SUPPORT FEED-FORWARD TEMPERATURE CONTROL BASED ON RF POWER

(71) Applicant: Lam Research Corporation, Fremont, CA (US)

(72) Inventors: Tao Zhang, San Ramon, CA (US); Siyuan Tian, Fremont, CA (US); Eric A. Pape, Campbell, CA (US); Jorge Jose Zaninovich, Walnut Creek, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 581 days.

(21) Appl. No.: 15/200,405

(22) Filed: Jul. 1, 2016

(65) Prior Publication Data

US 2018/0005857 A1    Jan. 4, 2018

(51) Int. Cl.
| | | |
|---|---|---|
| C23C 16/00 | (2006.01) |
| H01L 21/306 | (2006.01) |
| H01L 21/673 | (2006.01) |
| H01L 21/67 | (2006.01) |
| H01J 37/32 | (2006.01) |
| H01L 23/34 | (2006.01) |

(Continued)

(52) U.S. Cl.
CPC ...... *H01L 21/67389* (2013.01); *C23C 16/505* (2013.01); *H01J 37/321* (2013.01); *H01J 37/3244* (2013.01); *H01J 37/32522* (2013.01); *H01J 37/32532* (2013.01); *H01J 37/32724* (2013.01); *H01J 37/32926* (2013.01); *H01L 21/67248* (2013.01); *H01L 21/67383* (2013.01); *H01L 21/6831* (2013.01); *H01L 23/34* (2013.01); *H01J 2237/334* (2013.01)

(58) Field of Classification Search
CPC .......... H01J 37/32715; H01J 37/32724; H01J 37/32917; H01J 37/32926; H01J 37/32935; H01J 37/32522; H01L 23/34; H01L 23/345; H01L 37/32522; H01L 21/67248
See application file for complete search history.

(56) References Cited

U.S. PATENT DOCUMENTS

| | | | |
|---|---|---|---|
| 9,338,871 B2 | 5/2016 | Mahadeswaraswamy et al. |
| 2006/0042757 A1* | 3/2006 | Kanno ............ H01J 37/32935 |
| | | | 156/345.27 |

(Continued)

*Primary Examiner* — Luz L Alejandro Mulero

(57) ABSTRACT

A temperature controller is provided and includes interfaces, a compensation controller, summers, and a second controller. An interface receives a bias power signal and a plasma signal. The bias power signal indicates a bias RF power level of a RF generator. The plasma signal indicates a plasma RF power level of another RF generator. Another interface receives a temperature signal indicating a temperature of a substrate support. The compensation controller generates a compensation value based on a bias feed-forward transfer function and the bias RF power level and another compensation value based on a plasma feed-forward transfer function and the plasma RF power level. A summer generates an error signal based on a set point and the temperature. The second controller generates a control signal based on the error signal. Another summer controls an actuator to adjust the temperature based on the compensation values and the control signal.

14 Claims, 9 Drawing Sheets

(51) Int. Cl.
*C23C 16/505* (2006.01)
*H01L 21/683* (2006.01)

(56) References Cited

U.S. PATENT DOCUMENTS

| | | | |
|---|---|---|---|
| 2011/0186545 A1* | 8/2011 | Mahadeswaraswamy | ................... H01J 37/32935 216/59 |
| 2013/0135058 A1 | 5/2013 | Long et al. | |
| 2015/0301100 A1* | 10/2015 | Valcore, Jr. | ....... H01J 37/32174 702/59 |
| 2016/0131587 A1* | 5/2016 | Meloni | ............. H01J 37/32082 315/111.21 |

* cited by examiner

SYSTEM AND METHOD FOR SUBSTRATE SUPPORT FEED-FORWARD TEMPERATURE CONTROL BASED ON RF POWER

FIELD

The present disclosure relates to substrate processing systems, and more particularly to systems and methods for controlling temperatures of an electrostatic chuck in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, an ion implantation process, and/or other etch, deposition, and cleaning processes. A substrate may be arranged on a substrate support such as a pedestal, an electrostatic chuck (ESC), etc. in a processing chamber of the substrate processing system. For example, during etching in a PECVD process, a gas mixture including one or more precursors is introduced into the processing chamber and plasma is struck to etch the substrate.

During processing of a substrate, temperatures of the substrate and components of the substrate processing system may vary. These temperature variations may have undesirable effects on the resulting substrates (e.g., non-uniform critical dimensions). Accordingly, the substrate processing systems may implement systems and methods for controlling temperatures of the substrate and the components of the substrate processing system.

SUMMARY

A temperature controller for a substrate support in a substrate processing system. The temperature controller includes a first interface, a second interface, a compensation controller, a first summer, a second controller and a second summer. The first interface is configured to receive a bias power signal and a plasma signal. The bias power signal indicates a bias radio frequency (RF) power level of a first RF generator for the substrate support. The plasma signal indicates a plasma RF power level of a second RF generator. The second interface is configured to receive a temperature signal. The temperature signal indicates a temperature of the substrate support. The compensation controller is configured to generate (i) a first compensation value based on a bias feed-forward transfer function and the bias RF power level, and (ii) a second compensation value based on a plasma feed-forward transfer function and the plasma RF power level. The first summer is configured to generate an error signal based on a set point temperature and the temperature of the substrate support. The second controller is configured to generate a control signal based on the error signal. The second summer is configured to control an actuator to adjust the temperature of the substrate support based on the first compensation value, the second compensation value and the control signal.

In other features, a method of operating a temperature controller for a substrate support in a substrate processing system is provided. The method includes: receiving at a first interface of the temperature controller a bias power signal and a plasma signal, where the bias power signal indicates a bias RF power level of a first RF generator for the substrate support, and where the plasma signal indicates a plasma RF power level of a second RF generator; and receiving at a second interface of the temperature controller a temperature signal, where the temperature signal indicates a temperature of the substrate support. The method further includes: generating (i) a first compensation value based on a bias feed-forward transfer function and the bias RF power level, and (ii) a second compensation value based on a plasma feed-forward transfer function and the plasma RF power level; generating an error signal based on a set point temperature and the temperature of the substrate support; generating a control signal based on the error signal; and controlling an actuator to adjust the temperature of the substrate support based on the first compensation value, the second compensation value and the control signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
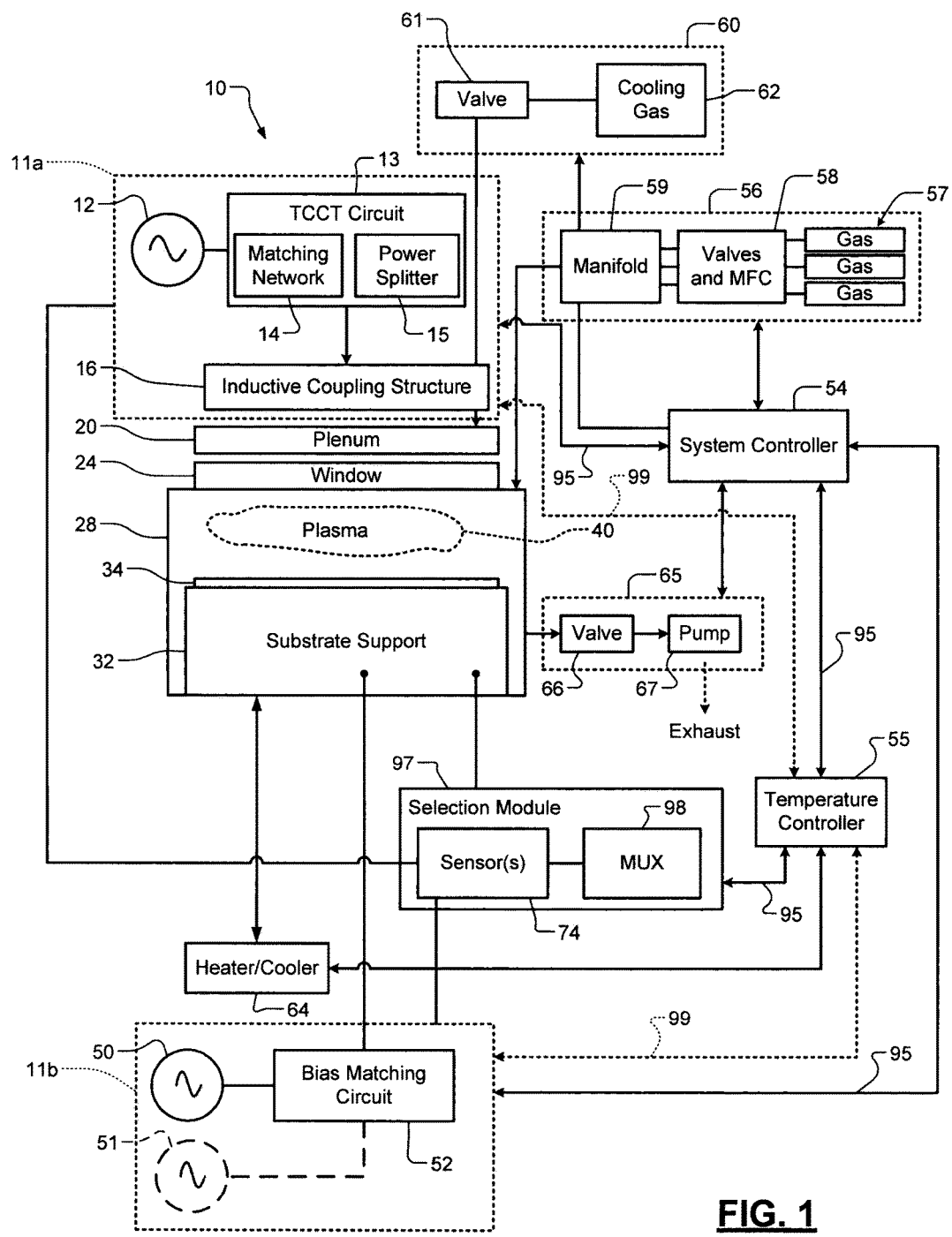
FIG. 1 is a functional block diagram of an example of a substrate processing system incorporating a temperature controller in accordance with an embodiment of the present disclosure.

As feature sizes of wafers continue to decrease, etching performance is becoming increasingly sensitive to substrate temperature variations. To improve etching performance, consistent wafer temperatures run-to-run (R2R) and chamber-to-chamber (C2C) are desired. However, there are many disturbances in plasma etching systems that can affect the temperature of a substrate support and the substrate. Some of the disturbances that can cause temperature fluctuations in a substrate support include changes in RF power, gas pressures, process gas mixtures, process gas flow rates, coolant flow, etc.

RF power variation may cause temperature differences across the substrate support, which may have one or more temperature controlled zones. A temperature controller determines a feed-forward compensation value to control the temperature of the substrate support and to compensate for RF power disturbances. The feed-forward compensation value for a current processing step is generated based on a duty cycle of RF power during a previous processing step and other feedback parameters. The feed-forward compensation value is constant during the processing step.

When performing mixed-mode pulsing that includes switching between different RF frequencies, the temperature of the substrate support and the substrate are unable to reach steady-state since the feed-forward compensation value is not accurate for a large portion of the recipe steps. As a result, temperature fluctuations of the substrate and substrate support on the order of several degrees Celsius may occur.

In addition, during an RF voltage control mode and while performing feed-forward control, RF forward power can vary during a single recipe step. The variation in RF voltage during the single recipe step is not accounted for in determining the feed-forward compensation value, which results in fluctuation in the temperature of the substrate and the substrate support. Another issue with traditional feed-forward control is that time delay for RF power to transition between different RF power levels is not accounted for in determining the feed-forward compensation value. Since the feed-forward compensation value may not be accurate for a current RF power level due to the delay in transitioning between RF power levels, additional undesired temperature fluctuation on the order of one degree Celsius can occur.

Systems and methods described below provide dynamic feed-forward control to compensate for changes in temperature of the substrate support due to changes in RE power, gas pressures, gas flow rates, chamber pressure, coolant pressures, coolant flow rates, and/or coolant temperatures. Sensors detect parameters corresponding to disturbances that affect substrate support temperature. Feedforward compensation values are generated based on the parameters.

A feed-forward control algorithm, based on the detected parameters, adjusts current to heating elements of the substrate support and may also adjust temperatures, pressures, and/or flow rates of coolant flowing to the substrate support. The quick response time allows for temperature control compensation and updating during processing steps and sub-steps to allow zones of the substrate support to reach steady-state temperatures, which improves R2R and C2C temperature consistencies.

Figure 2:
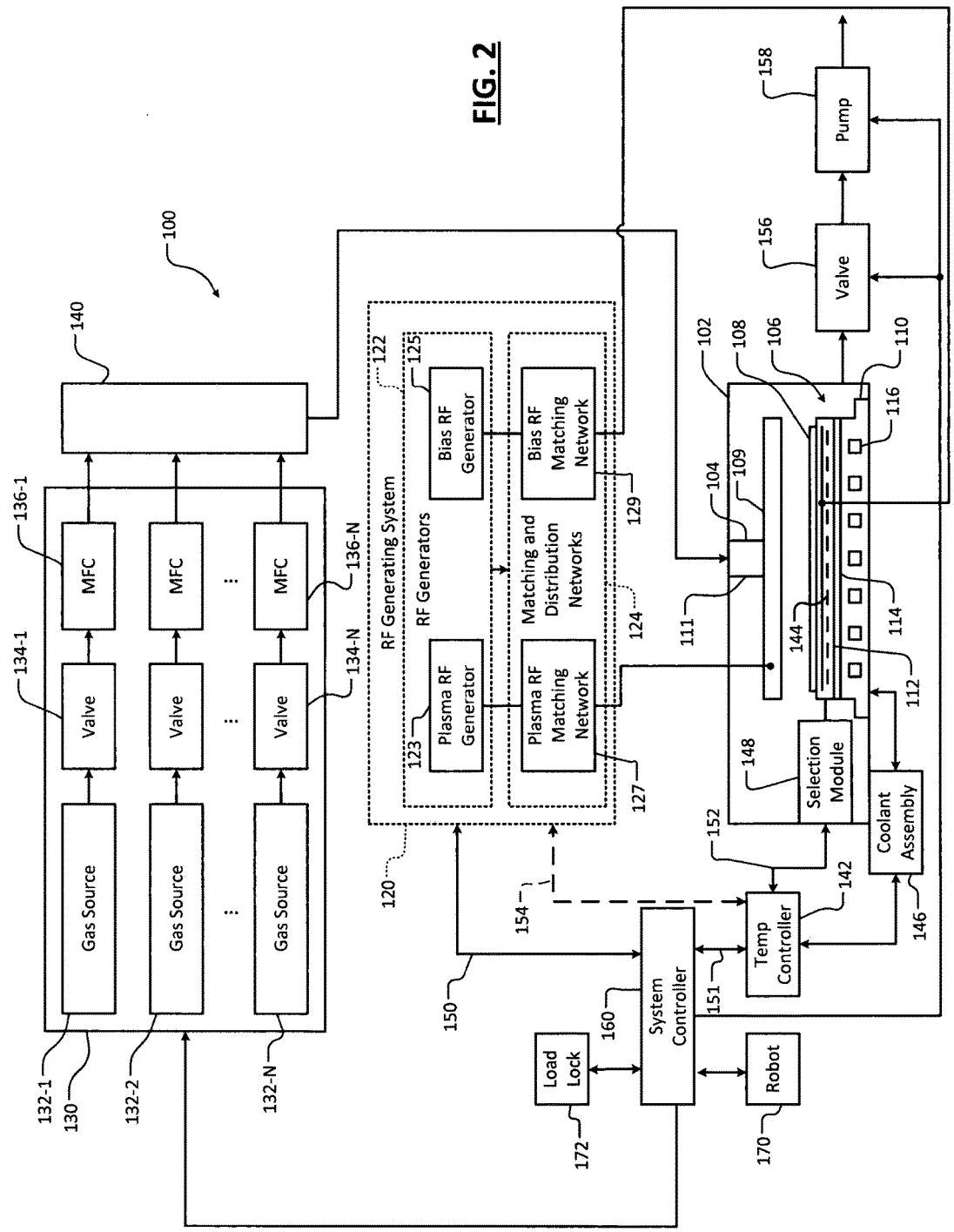
FIG. 2 is a functional block diagram of an example of another substrate processing system incorporating a temperature controller in accordance with an embodiment of the present disclosure.

The examples disclosed herein may be applied to transformer coupled plasma (TCP) systems, capacitive coupled plasma (CCP) systems, electron cyclotron resonance (ECR) plasma systems, inductively coupled plasma (ICP) systems and/or other systems and plasma sources. FIGS. 1-2 respectively show examples of a TCP system and a CCP system.

Referring now to FIG. 1, an example of a substrate processing system 10 is shown. While the foregoing description relates to an inductively coupled plasma (ICP) system, other types of ICP systems or other plasma processing systems may be used. The substrate processing system 10 includes RF generating systems 11a, 11b. In some examples, the RF generating system 11a includes an RF source 12 (e.g., a transformer coupled plasma RF generator) connected to a transformer coupled capacitive tuning (TCCT) circuit 13, which outputs current to an inductive coil structure 16.

The TCCT circuit 13 typically includes a matching network 14 and a power splitter 15. The matching network 14 may be connected by a transmission line to the RF source 12. The matching network 13 matches an impedance of the RF source 12 to the rest of the circuit including the power splitter 15 and the inductive coil structure 16. An example of a TCCT circuit 14 is shown and described in commonly assigned U.S. Publication No. 2013/0135058 to Long et al., which is hereby incorporated by reference in its entirety. In some examples, the inductive coil structure 16 may include a single inductive coil, a pair of inductive coils, or an inner inductive coil pair and an outer inductive coil pair. The power splitter 15 may be used to control the relative amount of inductive current supplied to coils of the inductive coil structure 16. While flat coils are shown, other types of coils may be used.

A gas plenum 20 may be arranged between the inductive coil structure 16 and a dielectric window 24. The dielectric window 24 is arranged along one side of a processing chamber 28. The processing chamber 28 further comprises a substrate support 32 that supports a substrate 34. The substrate support 32 may include an electrostatic chuck, a mechanical chuck or other type of chuck. Plasma 40 is generated inside of the processing chamber 28. The plasma 40 may be used to deposit film or to etch the substrate 34.

The RF generating system 11b may include one or more bias RF sources 50, 51 and a bias matching circuit 52. The RF source 50 provides a bias RF voltage to bias the substrate support 32 during operation. The bias matching circuit 52 matches an impedance of the RF sources 50, 51 to the electrode assembly. The RF generating systems 11a, 11b may be referred to collectively as a RF generating system 11 and are controlled by a system controller 54.

A gas delivery system 56 may be used to supply a gas mixture to the processing chamber 28 adjacent to the dielectric window 24. The gas delivery system 56 may include process gas sources 57, a metering system 58 such as valves and mass flow controllers, and a manifold 59 to mix the process gases.

A gas delivery system 60 may be used to deliver gas 62 via a valve 61 to the gas plenum 20. The gas may include cooling gas that is used to cool the inductive coil structure 16 and the dielectric window 24. A heater 64 may be used to heat the substrate support 32 to a predetermined temperature. An exhaust system 65 includes a valve 66 and pump 67 to remove reactants from the processing chamber 28 by purging or evacuation.

The system controller 54 may be used to control the etching process. The controller 54 monitors process parameters such as temperature, pressure, etc. and controls delivery of the gas mixture, striking, maintaining and extinguishing the plasma, removal of reactants, supply of cooling gas, etc. A temperature controller 55 controls temperature of the substrate support 32.

The system controller 54 may receive input signals from the sensors 74 and based on the input signals control operation of the RF generators 12, 50, 51, the bias matching circuit 52, and the heater/cooler 64 and/or components of the plasma processing system 10. The sensors 74 may be located in the RF generating systems 11a, 11b, in the chamber 28, in the substrate support 32, or elsewhere in the plasma processing system 10. The sensors detect, for example, supplied RF voltages, temperatures, gas and/or coolant flow rates, and gas and/or coolant pressures.

A selection module 97 may be connected to the temperature controller 55 and include the multi-range voltage sensors(s) 74 and a multiplexer (MUX) board 98. The selection module may be included in the processing chamber 28 or may be external to the processing chamber 28, as shown. The multiplexer board 98 selects one or more signals received from the one or more voltage sensors to send to the temperature controller 55. The temperature controller 55 controls temperature of the substrate support 32 based on the voltage signals received from the multiplexer board 98. The temperature controller 55 may receive RF voltage signals, indicating RF voltages generated by the RF generating systems 11a, 11b from the system controller 54 and/or directly from the RF generating systems 11a, 11b, as shown by dashed signal lines 99.

Ethernet for control automation technology (EtherCAT) mediums (or cables) 95 may exist between EtherCAT interfaces of the RF generating systems 11a, 11b, the system controller 54, the temperature controller 55, and the selection module 97. Analog mediums (or cables), for example the signal lines 99, may exist between the RF generating systems 11a, 11b and the temperature controller 55. Fast parameter transmission via the EtherCAT interfaces and/or analog interfaces is provided for quick/real-time response (e.g., 1 milli-second (ms) response time or less). The EtherCAT interfaces may each have a 1 kilo-Hertz (kHz) data transfer rate.

Referring now to FIG. 2, an example substrate processing system 100 for performing etching using RF plasma is shown. The substrate processing system 100 includes a processing chamber 102. The processing chamber 102 encloses other components of the processing chamber 102 and contains the RF plasma. The processing chamber 102 includes an upper electrode 104 and a substrate support 106 (e.g., an ESC). During operation, a substrate 108 is arranged on the substrate support 106.

For example only, the upper electrode 104 may include a showerhead 109 that introduces and distributes gases. The showerhead 109 may include a stem portion 111 including one end connected to a top surface of the processing chamber 102. The showerhead 109 is generally cylindrical and extends radially outwardly from an opposite end of the stem portion 111 at a location that is spaced from the top surface of the processing chamber 102. A substrate-facing surface of the showerhead 109 includes holes through which process or purge gas flows. Alternately, the upper electrode 104 may include a conducting plate and the gases may be introduced in another manner.

The substrate support 106 includes a conductive baseplate 110 that acts as a lower electrode. The baseplate 110 supports a heating plate 112, which may be formed at least partially of a ceramic material. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 104 and/or the baseplate 110. As an example, a plasma RE generator 123, a bias RF generator 125, a plasma RF matching network 127 and a bias RF matching network 129 are shown.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to TCEs 144 (sometimes referred to as actuators) arranged in the heating plate 112. Although shown separately from a system controller 160, the temperature controller 142 may be implemented as part of the system controller 160. As an example, the TCEs 144 may include, but are not limited to, respective macro TCEs (or first array of TCEs) corresponding to each macro zone of the heating plate 112 and/or micro TCEs (or second array of TCEs) corresponding to each micro zone of the heating plate 112. The macro TCEs may be used for coarse tuning temperatures and/or other fields of macro zones of the heating plate 112. The micro TCEs may be used for fine tuning temperatures and/or other fields of micro zones of the heating plates. The macro zones may include the micro zones. One or more micro zones may overlap two or more of the macro zones. The macro zones and the micro zones may have predetermined, matching, different, or any arbitrary shape.

The heating plate 112 includes multiple temperature controlled zones (e.g., 4 zones, where each of the zones includes 4 temperature sensors). Each of the temperature controlled zones has corresponding macro and/or micro TCEs. The macros TCEs are controlled to roughly achieve selected temperatures in each of the respective temperature controlled zones. The micro TCEs may be individually controlled to finely adjust temperatures within the respective temperature controlled zones and/or to compensate for temperature non-uniformities in each temperature controlled zone. For example, for each set point temperature of a macro TCE, a temperature distribution response across a top surface of the heating plate 112 may be known and mapped (i.e., stored in memory). Similarly, a temperature distribution response of each of the micro TCEs across the surface of the heating plate 112 may be known and mapped. Although the systems and methods disclosed herein are described with respect to multi-zone heating plates and/or ESCs, the principles of the present disclosure may be applied to other temperature-controlled components of a substrate processing system.

The temperature controller 142 may control operation and thus temperatures of the TCEs 144 to control temperatures of the substrate support 106 and a substrate (e.g., the substrate 108) on the substrate support 106. The temperature controller 142 may communicate with a coolant assembly 146 to control coolant flow (pressures and flow rates) through the channels 116. For example, the coolant assembly 146 may include a coolant pump and reservoir. The temperature controller 142 operates the coolant assembly 146 to selectively flow the coolant through the channels 116 to cool the substrate support 106 and the heating plate 112. The temperature controller 142 may control the rate at which the coolant flows and a temperature of the coolant.

The temperature controller 142 controls current supplied to the TCEs 144 and pressure and flow rates of coolant supplied to channels 116 based on detected parameters as further described below. A selection module 148 may transfer current to the TCEs 144 and/or receive signals from the temperature sensors in the substrate support 106 and/or sensors detecting pressures and flow rates of coolant passing through the channels 116. The selection module 148 may be located within the processing chamber 102 or may be external to the processing chamber 102. EtherCAT mediums (or cables) 150, 151, 152 may exist between EtherCAT interfaces of the RF generating system 120, the temperature controller 142, the system controller 160 and the selection module 148. An analog medium (or cable) 154 may exist between the RF generating system 120 and the temperature controller 142.

A valve 156 and pump 158 may be used to evacuate reactants from the processing chamber 102. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the substrate support 106. For example, the robot 170 may transfer substrates between the substrate support 106 and a load lock 172. The robot 170 may be controlled by the system controller 160. The system controller 160 may control operation of the load lock 172.

Figure 3:
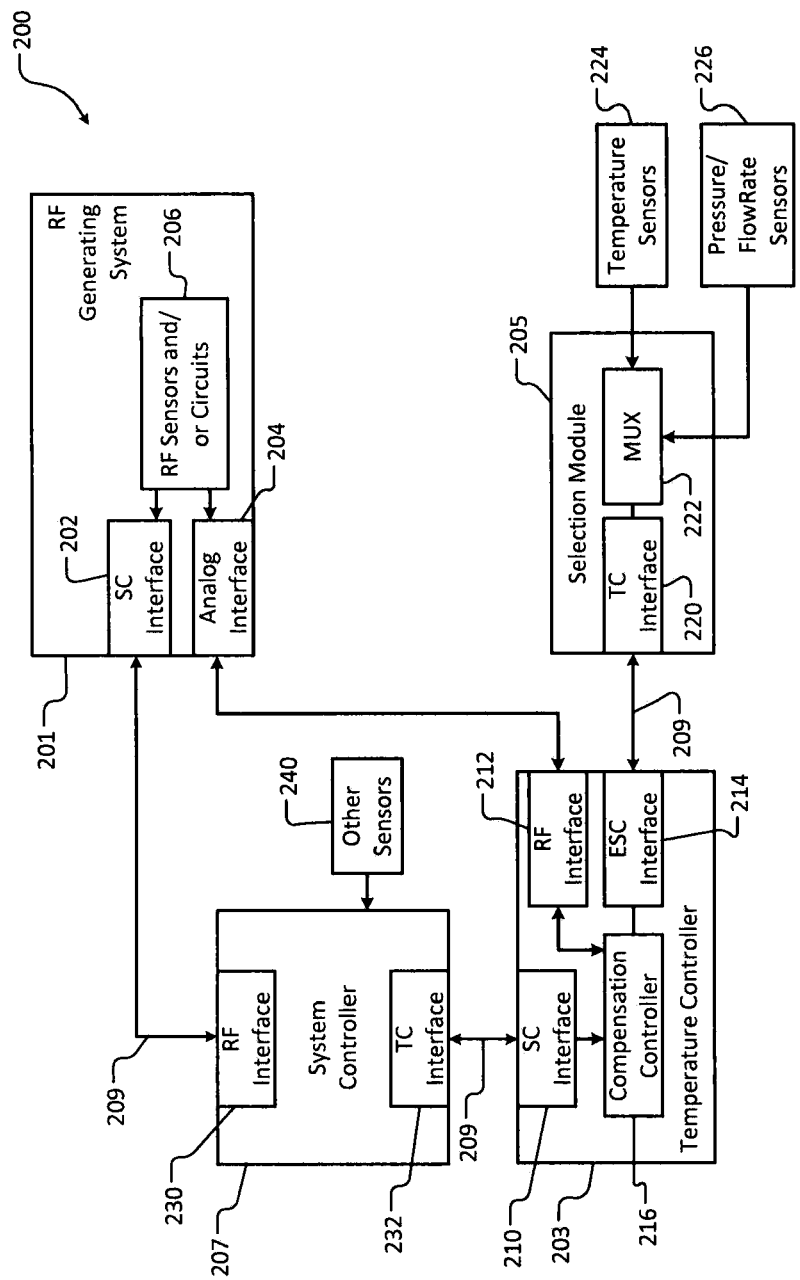
FIG. 3 is a functional block diagram of an example of a temperature control system in accordance with an embodiment of the present disclosure.

Referring now to FIGS. 1-2 and FIG. 3, which shows a temperature control system 200 that includes an RF generating system 201 (e.g., one of the RF generating systems 11, 120), a temperature controller 203 (e.g., one of the temperature controllers 55, 142), a selection module 205 (one of the selection modules 97, 148), and a system controller 207 (one of the system controllers 54, 160), which may be connected via mediums 209 (e.g., the mediums 95, 99, 150, 151, 152, and 154). The RF generating system 201 includes a system controller (SC) interface 202, a temperature controller (TC) interface 204 and RF sensors and/or circuits 206. The interfaces 202, 204 provide detected RF power levels detected and/or generated based on signals from, for example, the RF sensors and/or circuits 206 to the temperature controller 203 and the system controller 207 via the mediums 150, 154. The interface 202 may be an EtherCAT interface. The interface 204 may be an analog interface. The RF sensors and/or circuits 206 may include RF sensors, RF generators, RF matching circuits, etc.

The temperature controller 203 includes a SC interface 210, a RF interface 212, an ESC interface 214, and a compensation controller 216. The SC interface 210 may be an EtherCAT interface. The RF interface 212 may be an analog interface. The ESC interface 214 may be an EtherCAT interface. The compensation controller 216 generates compensation values to adjust temperature control of the substrate support 32, 106 of FIGS. 1-2. The compensation values are generated based on parameters received via the interfaces 210, 212, 214.

The selection module 205 includes a TC interface 220 and a multiplexer (MUX) board 222. The multiplexer board 222 receives sensor signals from temperature sensors 224 and pressure and flow rate sensors 226. The temperature sensors 224 may be located within the substrate support 32, 106 of FIGS. 1-2 and/or in one of the processing chambers 28, 102. The pressure and flow rate sensors 226 may detect pressure and/or flow rate of coolant passing through channels 116 of the substrate support 32, 106 of FIGS. 1-2, chamber pressure, and/or other pressures and/or flow rates within the processing chamber 102. The multiplexer board 222 may receive signals from other sensors within the processing chamber 102. The multiplexer board 222 processes the sensor signals and selectively provides the signals to the temperature controller 203 via the interfaces 214, 220. The signal processing may include amplifiers, filters, and analog-to-digital converters for amplifying, filtering, and analog-to-digital converting sensor signals. The multiplexer board 222 may include one or more multiplexers for selecting one or more of the sensor signals to provide to the TC interface 220.

The system controller 207 includes an RF interface 230 and a TC interface 232. The RF interface 230 is connected to the SC interface 202. The TC interface 232 is connected to the SC interface 210. The system controller 207 may pass signals received from the SC interface 202 to the compensation controller 216 via the interfaces 230, 232. The system controller 207 may receive signals from other sensors 240. The other sensors 240 may include various sensors of the processing systems 10, 100 of FIGS. 1-2, such as pressure and/or flow rate sensors for detecting pressures and flow rates of gases supplied to the processing chamber 102.

The EtherCAT interfaces 202, 210, 214, 220, 230, 232, may convert received signal and/or processed signals to Ethernet packets prior to transmission over the mediums 209. The EtherCAT interfaces 202, 210, 214, 220, 230, 232 and the analog interfaces 204, 212 provide fast transfer of data to temperature controller 203 and the compensation controller 216. The analog interfaces 204, 212 transfer analog signals between (i) the RF generating system 120 and (ii) the temperature controller 203 and the compensation controller 216.

Figure 4:
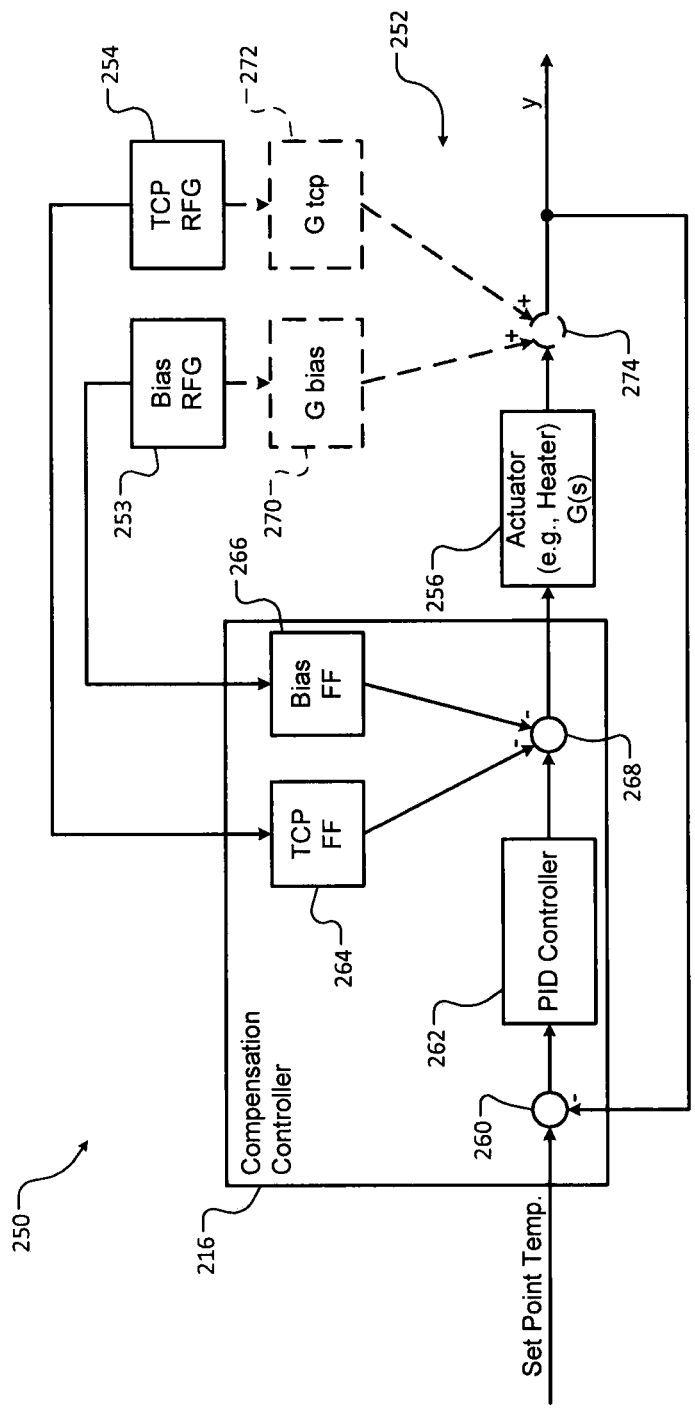
FIG. 4 is a functional block diagram of an example of a feed-forward system and a temperature control model including RF feed-forward power based temperature control in accordance with an embodiment of the present disclosure.

FIG. 4 shows a feed-forward system 250 and a temperature control model 252 including RF feed-forward power based temperature control for a TCP system, such as the plasma processing system of FIG. 1. The feed-forward system 250 may be modified for the CCP-based system of FIG. 2 and/or for other plasma processing systems. The feed-forward system 250 includes the compensation controller 216, a bias RF generator 253, a TCP RF generator 254, and an actuator (e.g., a heater having multiple TCEs) 256. Although the feed-forward system 250 is shown for controlling current to a heater having multiple TCEs, the feed-forward system 250 may be implemented for: one or more TCEs; valves and/or a pump of the cooling assemblies 64, 146 of FIGS. 1-2; and/or other actuators. Values of the feed-forward system 250 may be modified to adjust valve position, fluid pressure and/or flow rate, pump speed, etc.

The compensation controller 216 includes a first summer 260, a proportional integral derivative (PID) controller 262, a TCP feed-forward (FF) controller 264, a bias FF controller 266, and a second summer 268. The TCP FF controller 264 implements a TCP FF transfer function for feed-forward compensation. The bias FF controller 266 implements a bias FF transfer function for feed-forward compensation. In one embodiment, the controllers 264, 266 are not included and the compensation controller 216 implements the TCP FF transfer function and the bias FF transfer function.

The temperature control model 252 includes a bias RF generator disturbance model 270 (or transfer function), a TCP RF generator disturbance model 272 (or transfer function), and a third summer 274. The bias RF generator disturbance model 270 represents disturbance on ESC temperature associated with RF power generated by the bias RF generator. The TCP RF generator disturbance model 272 represents disturbance on ESC temperature associated with RF power generated by the TCP generator. If the feed-forward system 250 is applied to a CCP system, the TCP FF controller 264 may be replaced with a CCP FF controller. Similarly, the TCP RF generator disturbance model 272 may be replaced with a CCP RF generator disturbance model.

Figure 6:
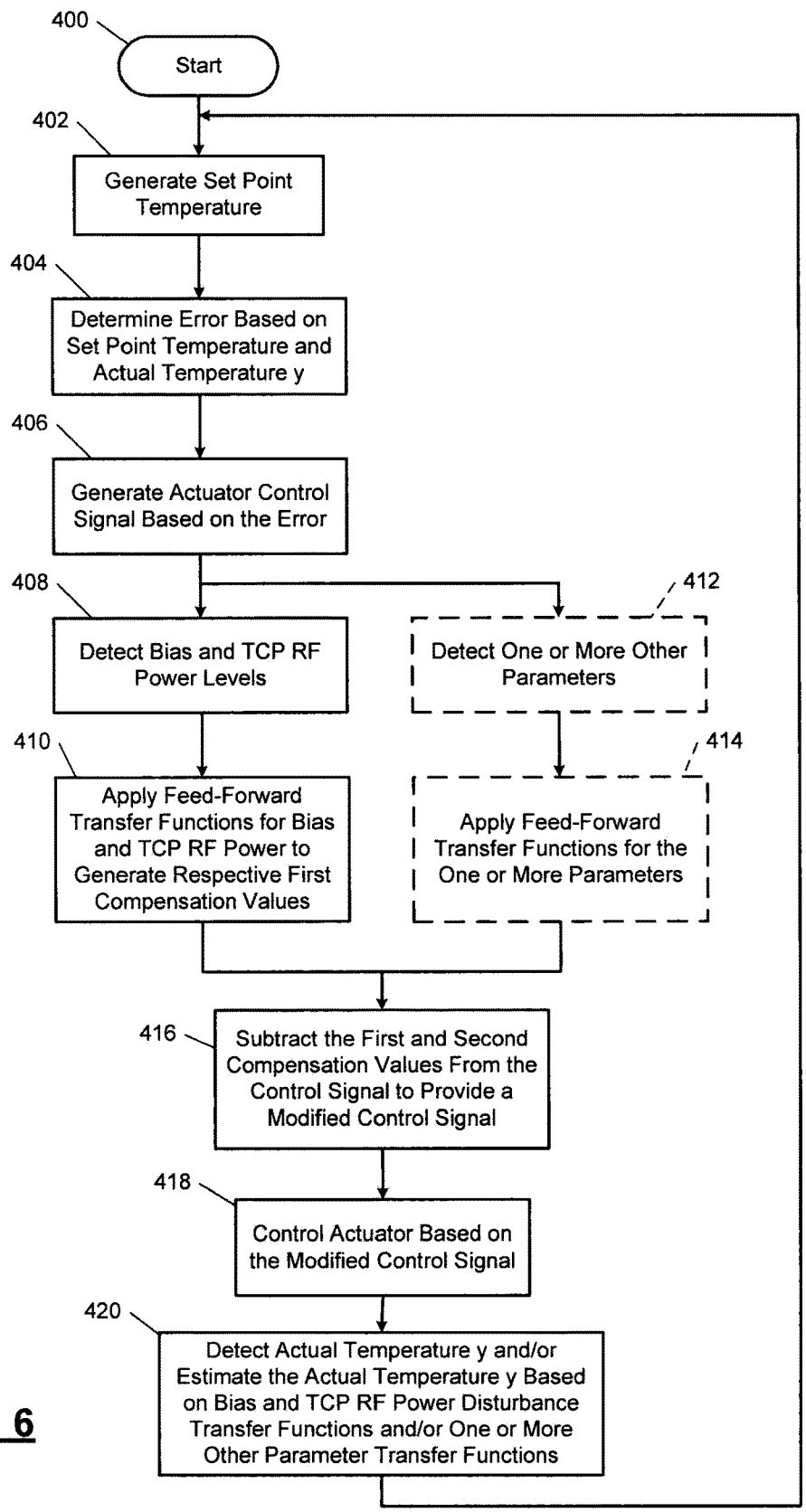
FIG. 6 illustrates an example method of controlling temperatures of an ESC in accordance with an embodiment of the present disclosure.

Operation of the feed-forward system 250 of FIG. 4 is further described below with respect to the method of FIG. 6.

Figure 5:
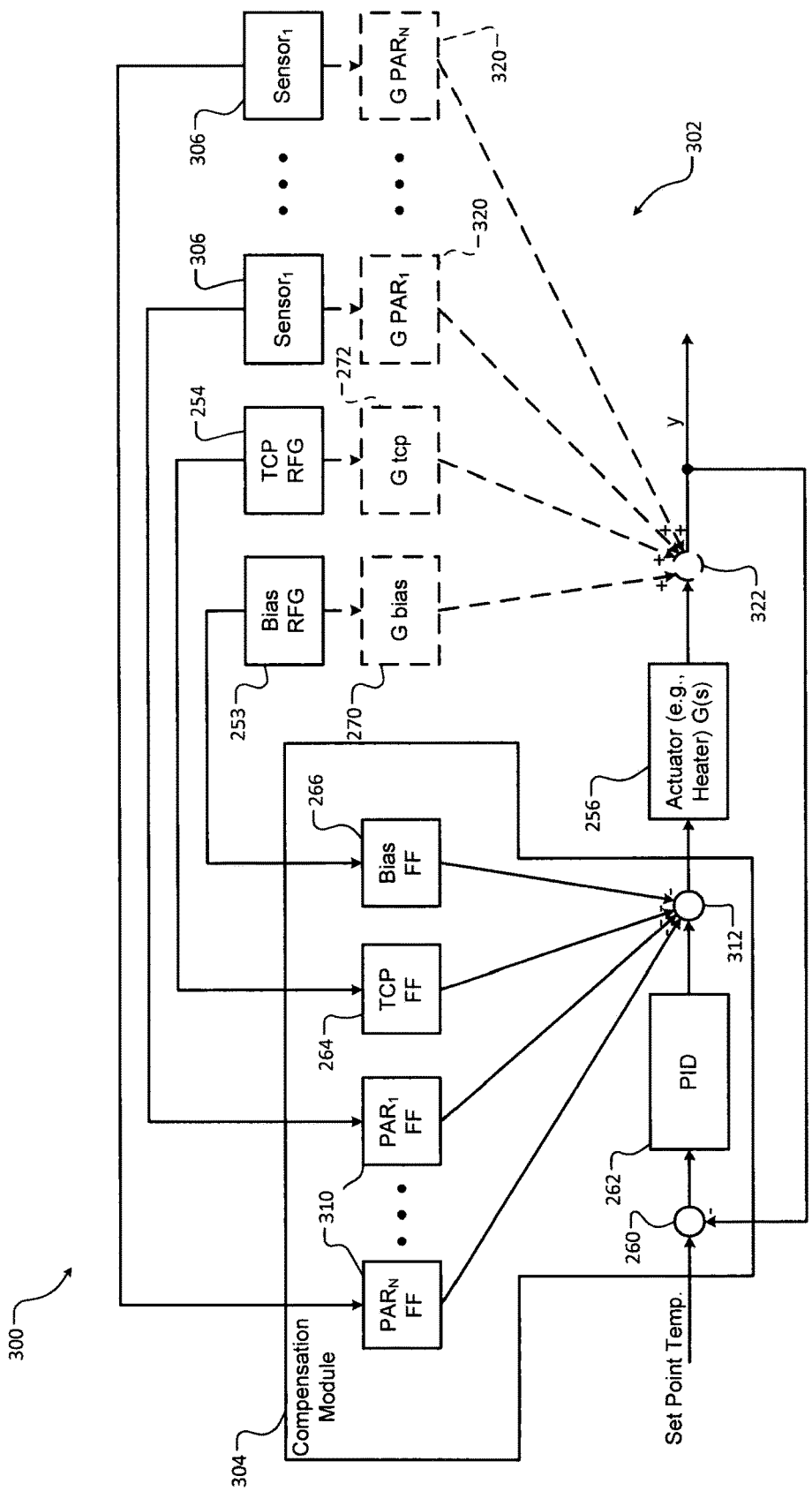
FIG. 5 is a functional block diagram of an example of a feed-forward system and a temperature control model including RF feed-forward power and other parameter based temperature control in accordance with an embodiment of the present disclosure.

FIG. 5 shows a feed-forward system 300 and a temperature control model 302 including RF feed-forward power and other parameter based temperature control. Although the feed-forward system 300 is shown as a TCP type system, which may be used for the plasma processing system of FIG. 1, the feed-forward system 300 may be modified for the CCP-based system of FIG. 2 and/or for other plasma processing systems. The feed-forward system 300 is a higher order more complex system that than the feed-forward system 250 of FIG. 4 due to the accounting for additional parameters that impact temperatures of the substrate support 32 or 106 of FIGS. 1-2. The feed-forward system 300 includes a compensation controller 304, the bias RF generator 253, the TCP RF generator 254, one or more sensors 306, and the actuator 256. Although the feed-forward system 300 is shown for a controlling current to a heater having multiple TCEs, the feed-forward system 300 may be implemented for: one or more TCEs; valves and/or a pump of the cooling assemblies 64, 146 of FIGS. 1-2; and/or other actuators. Values of the feed-forward system 300 may be modified for controlling valve position, fluid pressure and/or flow rate, pump speed, etc.

The compensation controller 304 includes the first summer 260, the PID controller 262, the TCP feed-forward (FF) controller 264, the bias FF controller 266, one or more parameter FF controllers$_{1-N}$ 310, and a second summer 312. The TCP FF controller 264 implements a TCP FF transfer function for feed-forward compensation. The bias FF controller 266 implements a bias FF transfer function for feed-forward compensation. The one or more parameter FF controllers$_{1-N}$ 310 implement respective FF transfer functions for feed-forward compensation with respect to a corresponding one or more parameters. The one or more parameters may include, for example, gas pressures, gas flow rates, coolant pressures, coolant flow rates, coolant temperatures and/or other parameters that impact temperatures of a substrate support. In one embodiment, the controllers 264, 266, 310 are not included and the compensation controller 216 implements the TCP FF transfer function, the bias FF transfer function and the one or more parameter FF transfer functions.

The temperature control model 302 includes the bias RF generator disturbance model 270, the TCP RF generator disturbance model 272, one or more parameter disturbance models$_{1-N}$ 320 (or transfer functions), and a third summer 322. The one or more parameter disturbance models represent respective disturbances on substrate support temperature associated with the corresponding one or more parameters.

Operation of the feed-forward system 300 of FIG. 5 is further described below with respect to the method of FIG. 6.

For further defined structure of the controllers of FIGS. 1-5 see below provided methods of FIGS. 6 and 8 and below provided definition of the term "controller". The systems disclosed herein may be operated using numerous methods. An example method is illustrated in FIG. 6. In FIG. 6, a method of controlling temperatures of a substrate support is shown. Although the following tasks are primarily described with respect to the implementations of FIGS. 1-5, the tasks may be easily modified to apply to other implementations of the present disclosure. Also, although the following tasks are described for a single set point temperature, the tasks may be performed for multiple set point temperatures, where each of the set point temperatures is associated with an area and/or zone of a substrate support. In addition, although the tasks are primarily described with respect to detecting, transferring, receiving and performing tasks based on bias and TCP RF power levels, the tasks may be modified for detecting, transferring and receiving other RF power levels for other corresponding RF generators. The tasks may be iteratively performed.

The method may begin at 400. At 402, a temperature controller 203 and/or a system controller 207 determines a set point temperature for an area of a substrate support (e.g., one of the substrate support 32, 106).

At 404, the first summer 260 compares the set point temperature to an actual temperature y. The actual temperature y may have been previously detected and/or estimated and is subtracted from the set point temperature. The actual temperature y may be detected and/or estimated at 420, as described below. The difference between the set point temperature and the actual temperature y provides an error, which is indicated as an error signal. At 406, the PID controller 262 generates a control signal based on the error signal.

At 408, the temperature controller receives RF power levels from the system controller and/or a RF generating system (one of the RF generating systems 11, 120) via the EtherCAT interfaces 202, 210, 230, 232 and/or analog interfaces 204, 212. The RF power levels are provided to the controllers 264, 266.

At 410, the controllers 264, 266 apply feed-forward transfer functions for bias RF power and TCP RF power to generate respective first compensation values. This may include, for example, multiplying (i) the transfer function of equation 1 with the bias RF power level to provide a first compensation value, and (ii) the transfer function of equation 2 with the TCP RF power level to provide a second compensation value, where $FF_{bias}(s)$ and $FF_{tcp}(s)$ are feed-forward functions in the Laplace transform domain, $kk_{bias}$ and $kk_{tcp}$ are gains for bias RF power and TCP RF power and may be represented by expressions 3-4, T is a time constant, $LL_{bias}$, $L_{bias}$, $LL_{tcp}$, and $L_{tcp}$ are bias and TCP time delays, $k_{bias}$ and $k_{tcp}$ are gains for a bias RF power disturbance transfer function and a TCP RF power disturbance transfer function, k is plant gain for the actuator 256, and L is a time delay constant for the actuator. The variable s may be represented by equation 5, where σ and ω are real numbers and j is the square root of −1. The bias and TCP time delays $LL_{bias}$, $LL_{tcp}$ may be defined by expressions 3-4. The time delays $L_{bias}$, $L_{tcp}$ are delays from when changes in RF power occur to when RF power disturbances in temperatures (i.e. changes in temperatures) of the substrate support occur.

$$FF_{bias}(s) = \frac{kk_{bias}(Ts + 1)}{(T_{bias}s + 1)} e^{-LL^s_{bias}} \quad (1)$$

$$FF_{tcp}(s) = \frac{kk_{tcp}(Ts + 1)}{(T_{tcp}s + 1)} e^{-LL^s_{tcp}} \quad (2)$$

$$kk_{bias} = \frac{k_{bias}}{k}, LL_{bias} = L_{bias} - L \quad (3)$$

$$kk_{tcp} = \frac{k_{tcp}}{k}, LL_{tcp} = L_{tcp} - L \quad (4)$$

$$s = \sigma + j\omega \quad (5)$$

In one embodiment, the gains $kk_{bias}$ and $kk_{tcp}$ are determined for each sub-step of a processing step of a plasma process. For example, the gains $kk_{bias}$ and $kk_{tcp}$ may be determined for each sub-step (e.g., plasma OFF sub-step (or no plasma generated), TCP RF power ON sub-step, and TCP RF power and bias RF power ON sub-step). In one embodiment, the gains $kk_{bias}$ and $kk_{tcp}$ are calibrated for each sub-step as described below with respect to FIG. 8. The method of FIG. 8 may be performed prior to and/or during task 410.

At 412, the temperature controller 203 receives sensor signals from sensors, (e.g., sensors 224, 226, 240 or other sensors), the system controller 207, and/or the selection module 205 via the MUX board 222 and the EtherCAT interfaces 214, 220. The sensor signals are provided to the controllers 310.

At 414, the controllers 310 apply feed-forward transfer functions for parameters associated with the sensor signals to generate respective second compensation values. This may include multiplying each version of the transfer function of equation 6, for each of the parameters associated with the sensor signals, with a detected value to provide a respective one of the second compensation values, where $FF_{par}(s)$ is a feed-forward function in the Laplace transform domain for the corresponding parameter, $kk_{par}$ is gain for the corresponding parameter and is represented by expressions 7, T is a time constant, $LL_{par}$ and $L_{par}$ are parameter delays for the corresponding parameter, and $k_{par}$ is a gain for a parameter disturbance transfer function for the corresponding parameter. Each of the parameter time delays $L_{par}$ refers to a time delay from when the parameter is adjusted to when temperatures of the substrate support change due to that adjustment. $LL_{par}$ may be defined by expressions 7.

$$FF_{par}(s) = \frac{kk_{par}(Ts+1)}{T_{par}(s+1)} e^{-LL^s_{par}} \quad (6)$$

$$kk_{par} = \frac{k_{par}}{k}, LL_{par} = L_{par} - L \quad (7)$$

In one embodiment, the gain $kk_{par}$ is calibrated for each sub-step as described below with respect to FIG. 8. The method of FIG. 8 may be performed prior to and/or during task 414.

At 416, the second summer 268 subtracts the compensation values generated at 410 and/or 414 from the control signal generated by the PID controller 262. A result of the subtraction provides a modified control signal, which may be provided to and/or used to control the actuator 256. At 418, the actuator 256 is controlled and/or operated based on the modified control signal. As an example, if the actuator 256 is a heater having one or more TCEs, current supplied to the one or more TCEs may be modified. As another example, if the actuator 256 is a valve or pump for controlling pressure and/or flow rate of coolant to one or more channels of the substrate support, position of the valve and/or speed of the pump may be adjusted.

At 420, the actual temperature of the substrate support may be detected and/or estimated. The actual temperature of the substrate support may be detected based on a signals received from one or more temperature sensors (e.g., the temperature sensors 224) in the substrate support. Temperature signals may be provided via the EtherCAT interfaces 214, 220 to the compensation controller 216 or 304. If the actual temperature is estimated, transfer functions associated with models 270, 272, and/or 320 may be multiplied respectively by the bias RF power, the TCP RF power, and/or outputs of the sensors 306 and provided to a third summer (one of the summers 274 and 322). An example of the transfer function for 270 is provided by equation 8. An example of the transfer function for 272 is provided by equation 9. An example for each of the transfer functions of the models 320 is provided by equation 10. The modified control signal out of the second summer (summer 268 or summer 312) is multiplied by a transfer function for the actuator 256. An example of the transfer function for the actuator 256 is provided by equation 11. The transfer function of equation 11 is a multi-zone temperature model, where k is plant gain, L is a time delay, and T is a time constant. A result of this multiplication is also provided to the third summer. The third summer sums the received signals to provide the estimated temperature.

$$G_{bias} = \frac{k_{bias}}{T_{bias}s+1} e^{-L^s_{bias}} \quad (8)$$

$$G_{TCP} = \frac{k_{TCP}}{T_{TCP}s+1} e^{-L^s_{TCP}} \quad (9)$$

$$G_{Par} = \frac{k_{Par}}{T_{Par}s+1} e^{-L^s_{Par}} \quad (10)$$

$$G(s) = \frac{k}{Ts+1} e^{-Ls} \quad (11)$$

Task 402 may be performed subsequent to task 420.

By using EtherCAT interfaces and/or analog interfaces, differences between the time delays associated with the above-described transfer functions are minimized. For example, the time delay associated with the bias feed-forward transfer function matches and/or is similar to the time delay associated with the model 270. As another example, the time delay associated with the TCP feed-forward transfer function matches and/or is similar to the time delay associated with the model 272. As yet another example, the time delay associated with one of the parameter feed-forward transfer functions matches and/or is similar to the time delay associated with the corresponding one of the models 320. The minimal differences in time delays minimize jitter in feed-forward inputs and prevent fluctuations in temperatures of a substrate support. This minimizes noise and improves timing accuracy in adjusting the control signal for the actuator 256.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Figure 7:
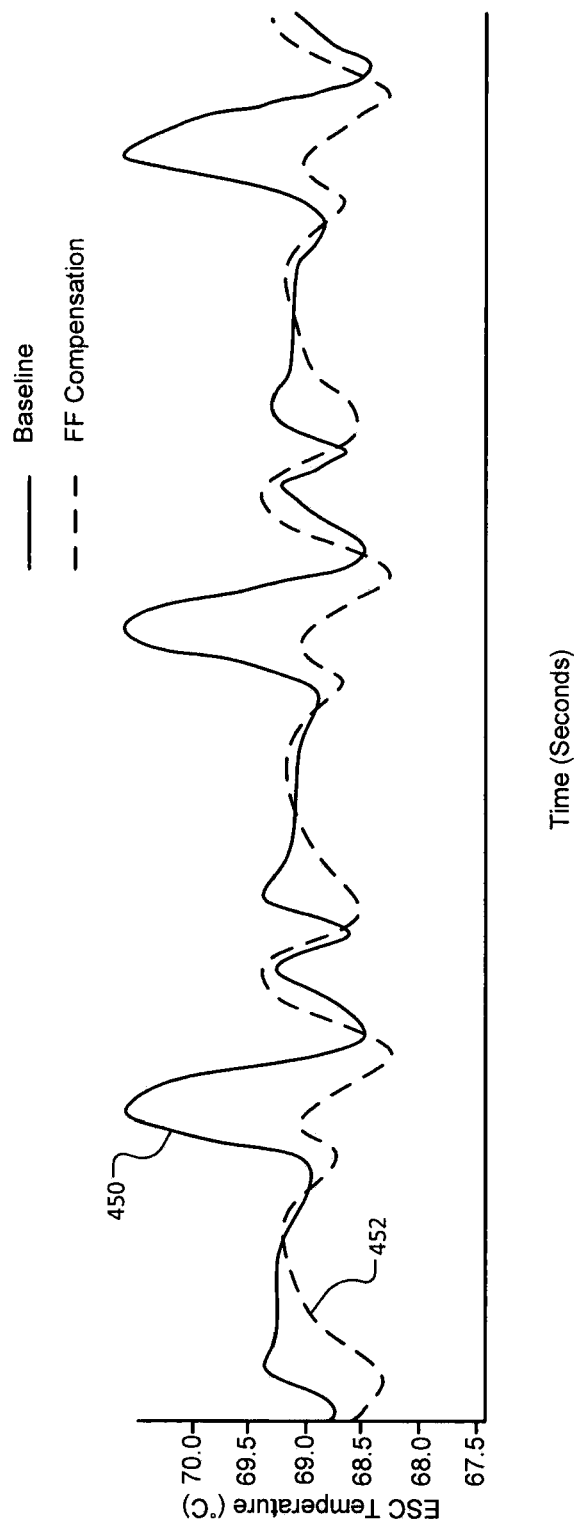
FIG. 7 is an example plot of temperature versus time illustrating decreased temperature range variation for the temperature control system of FIG. 3.

FIG. 7 shows a plot of temperature versus time illustrating decreased temperature range variation for the temperature control system of FIG. 3. FIG. 7 shows a baseline plot 450 and a feed-forward compensation plot 452. The baseline plot show temperature variation without feed forward compensation disclosed herein. Plot 452 shows reduced temperature variation due to the feed forward compensation disclosed herein. In the example shown, the temperature variation is reduced from 2.5° C. to 1.3° C. and the run-to-run repeatability drops from 0.6° C. to 0.3° C.

Compared with traditional methods, the above-disclosed method uses detected RF generator signals to improve compensation accuracy. The RF generator signals indicate RF power levels and are provided via EtherCAT and/or analog signals for quick response times in temperature control to changes in RF power levels. The disclosed method compensates for various disturbances for different operating conditions with different gas, pressure and temperature set points. The disturbances include changes in RF power levels, gas flow rates (e.g., a flow rate of helium), gas pressures, chamber pressure, wafer pressure set point, baseplate temperature, etc. Model accuracy is provided through recipe and/or gain calibration and learning, as is further described below with respect to FIGS. 8-10.

Figure 8:
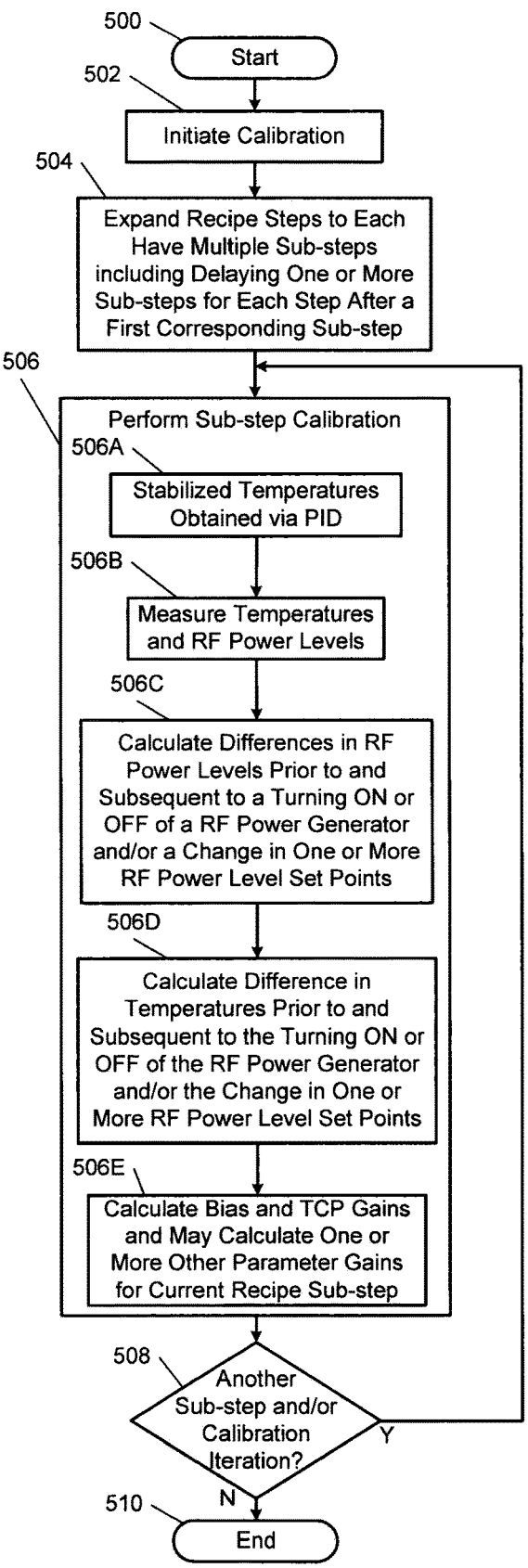
FIG. 8 illustrates an example calibration method in accordance with an embodiment of the present disclosure.

FIG. 8 shows a calibration method. The calibration method may be performed for each processing run or may be performed prior to each processing run and the determined gain values may be used during subsequent processing runs. If the calibration is performed prior to a process run, a dummy wafer may be processed and/or a recipe for a dummy wafer may be used. Alternatively, gain values may be determined during sub-steps of a previous run and used for sub-steps of a subsequent run. Although the following tasks are primarily described with respect to the implementations of FIGS. 1-5, the tasks may be easily modified to apply to other implementations of the present disclosure. The tasks may be iteratively performed. Although the following tasks are primarily described for a TCP system, the tasks may be applied to CCP systems and/or other plasma processing systems.

The method may begin at 500. At 502, bias and TCP gain values $kk_{bias}$ and $kk_{tcp}$ may be reset to 0. If gain values (e.g., $kk_{par}$) for other parameters are also being learned/calculated, then these gain values may also be set to 0.

At 504, the compensation controller 216 or 304, the temperature controller 203 and/or the system controller 207 expands (or divides) recipe steps into multiple sub-steps. This may include delaying one or more of the sub-steps that are performed subsequent to a first sub-step. For example, an etching step may include 3 sub-steps, the first sub-step being a no plasma step, the second sub-step being a TCP RF power ON step, and the third sub-step being a TCP and bias power ON step. Plasma exists during the second and third sub-steps. The second and third sub-steps may be delayed to learn the gain values.

At 506, calibration for a sub-step is performed. At 506A, stabilized temperatures are obtained via the PID 262.

At 506B, temperatures and RF power levels are measured and provided to the compensation controller 216 or 304, as described above. This may include learning a stabilized multi-zone duty cycle value for a given RF power condition. RF power levels and/or multi-zone duty cycle values may be averaged for a last predetermined period of time (e.g., 5 seconds). The averaged values may be saved in memory. This may further include learning stabilized (or steady-state) temperatures for a given RF power condition. Temperatures may be averaged for a last predetermined period of time (e.g., 5 seconds). The one or more average temperatures are saved in memory.

As an example, for a first sub-step, a steady-state multi-zone duty cycle may be learned with plasma OFF and TCP and bias RF power OFF and a multi-zone temperature reading stabilized at temperature set points. Average multi-zone duty cycle values are saved in memory for sub-step 1. For a second sub-step, a steady-state multi-zone duty cycle may be learned with plasma ON, TCP RF power ON, bias RF power OFF and a multi-zone temperature reading stabilized at temperature set points. Average multi-zone duty cycle values are saved in memory for sub-step 2. For a third sub-step, a steady-state multi-zone duty cycle may be learned with plasma ON, TCP RF power ON, bias RF power ON and a multi-zone temperature reading stabilized at temperature set points. Average multi-zone duty cycle values are saved in memory for sub-step 3.

At 506C, the compensation controller 216 or 304 calculated differences in RF power levels (or the averaged RF power levels determined at 506B) prior to and subsequent to a turning ON or OFF of an RF generator and/or a change in one or more RF power level set points.

At 506D, the compensation controller 216 or 304 calculated differences in temperatures (or the average temperatures determined at 506B) prior to and subsequent to a turning ON or OFF of an RF generator and/or a change in one or more RF power level set points.

Tasks 506C and 506 D may also be performed when changes in other parameter set points occur. For example when gas or coolant flow rates and/or pressures are changed, as described above.

At 506E, the compensation controller 216 or 304 calculates gains (e.g., $kk_{bias}$ and $kk_{tcp}$ and may calculate one or more parameter gains, such as $kk_{par}$). The gains $kk_{bias}$ and $kk_{tcp}$ may be calculated using, for example, equations 12-13 rather than equations 3-4. For equation 12, $u_0$ is the duty cycle in sub-step 1 (averaged during the last predetermined period) with TCP and bias RF power OFF, $u_{tcp}$ is the duty cycle in sub-step 2 (averaged over the last predetermined period) with TCP RF power ON and bias RF power OFF, $RFG_{tcp1}$ is the forward power (averaged over the last predetermined period) of a TCP RF power state 1, $DC_{pulse1}$ is the state 1 duty cycle of TCP RF pulsing when operated in a pulsing mode, $RFG_{tcp2}$ is the forward power (averaged over the last predetermined period) of a TCP RF power state 2, $DC_{pulse2}$ is the state 2 duty cycle of TCP RF pulsing when operated in a pulsing mode, and $f_{G,1}$ is a feed-forward TCP gain scale factor.

$$kk_{tcp} = \frac{u_0 - u_{tcp}}{RFG_{tcp1} \cdot DC_{pulse1} + RFG_{tcp2} \cdot DC_{pulse2}} \cdot f_{G,1} \quad (12)$$

$$kk_{bias} = \frac{u_{tcp} - u_{bias}}{RFG_{bias} \cdot DC_{pulse1} + RFG_{bias2} \cdot DC_{pulse2}} \cdot f_{G,1} \quad (13)$$

For equation 13, $u_{tcp}$ is the duty cycle in sub-step 2 (averaged during the last predetermined period) with TCP RF power ON and bias RF power OFF, $u_{bias}$ is the duty cycle in sub-step 3 (averaged over the last predetermined period)

with TCP RF power and bias RF power ON, $RFG_{bias1}$ is the forward power (averaged over the last predetermined period) of a bias RF power state 1, $DC_{pulse1}$ is the state 1 duty cycle of TCP RF pulsing when operated in a pulsing mode, $RFG_{bias2}$ is the forward power (averaged over the last predetermined period) of a bias RF power state 2, $DC_{pulse2}$ is the state 2 duty cycle of TCP RF pulsing when operated in a pulsing mode, and $f_{G,2}$ is a feed-forward bias gain scale factor.

At 508, the compensation controller 216 or 304 performs another iteration of 506 if another sub-step is being performed and/or if another calibration iteration is to be performed for the same sub-step. If another sub-step is not being performed and/or if another iteration of task 506 is not to be performed, the method may end at 510.

The compensation controller 216 or 304 may perform task 506 for each sub-step of a performed process, for example for each sub-step of a stabilization step, an etching step, a passivation step, a deposition step, an ashing step, and/or other processing step. Task 506 may be performed for different types of sub-steps and/or portions of the sub-steps for example during timed sub-steps, at sub-step start points, at sub-step end points, etc.

If a sub-step has no TCP and bias RF power set points (i.e. not running plasma), then the above-described sub-step 1 may be performed and not sub-steps 2-3. If a sub-step has no bias RF power set point (i.e. plasma running with TCP RF power and not bias RF power), then above-described sub-step 1 and sub-step 2 may be performed and not sub-step 3.

Figure 9:
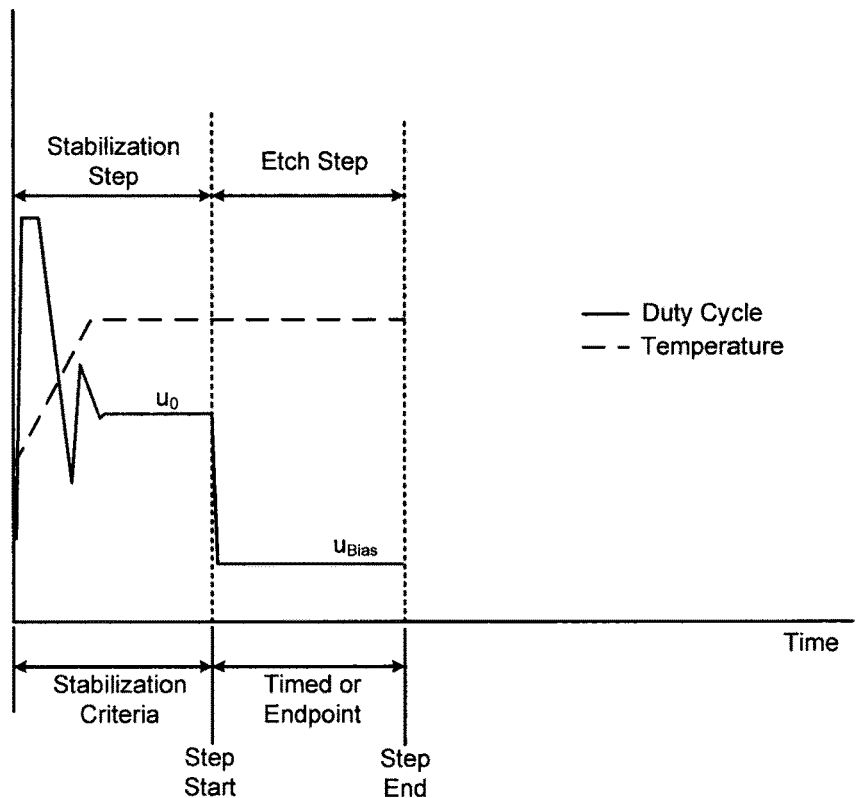
FIG. 9 is a plot of RF duty cycle and ESC temperature based on a traditional calibration technique.
Figure 10:
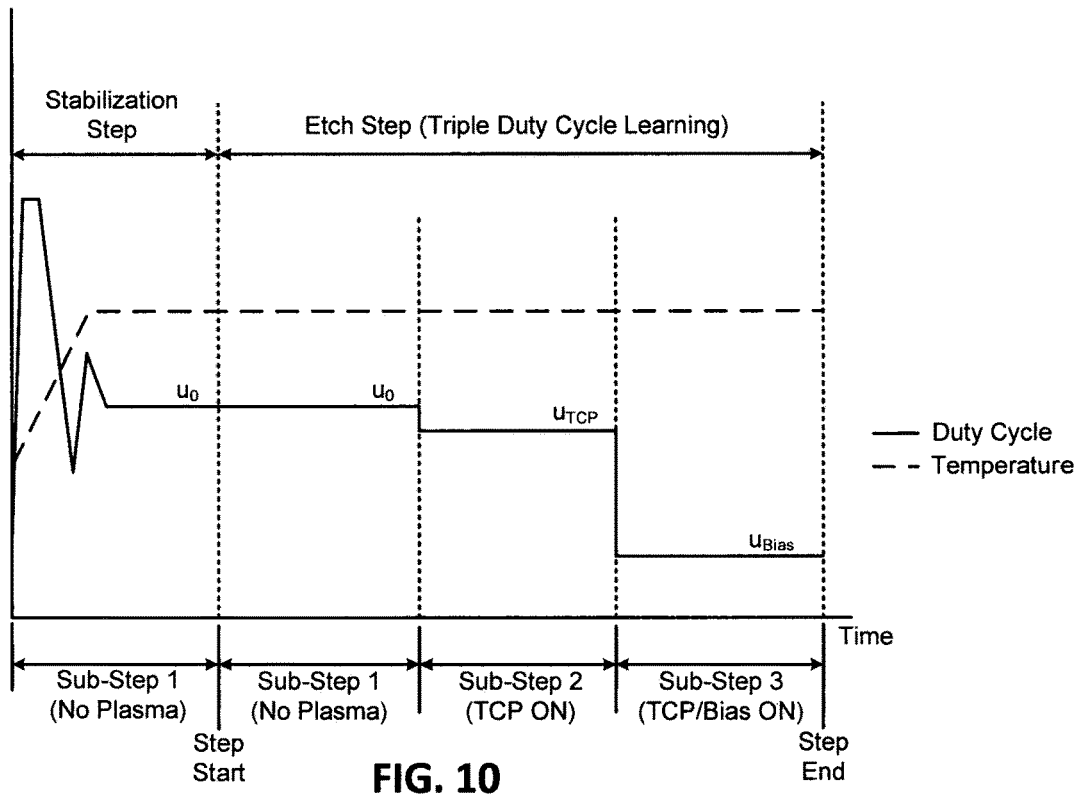
FIG. 10 is an example plot of RF duty cycle and ESC temperature based on calibration disclosed in accordance with an embodiment of the present disclosure.

FIG. 9 shows a plot of RF duty cycle and substrate support temperature based on a traditional calibration technique. The RF duty cycle is the duty cycle for multiple substrate support or ESC zones. As shown a single duty cycle is used during the etch step. FIG. 10 is a plot of RF duty cycle and substrate support temperature based on calibration disclosed herein. See, for example, the method of FIG. 8. The RF duty cycle is the duty cycle for multiple substrate support or ESC zones. Multiple duty cycles are shown for the etch step, where each of the duty cycles is for a respective one of the etch sub-steps (in this example there are 3 feedforward sub-steps). As an example, each of the sub-steps may be greater than 20 seconds in length.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature controller for a substrate support in a substrate processing system, the temperature controller comprising:
a first interface configured to receive a bias power signal and a plasma signal, wherein the bias power signal indicates a bias radio frequency (RF) power level of a first RF generator for the substrate support, and wherein the plasma signal indicates a plasma RF power level of a second RF generator;
a second interface configured to receive a temperature signal, wherein the temperature signal indicates a temperature of the substrate support;
a compensation controller configured to independently generate (i) a first compensation value based on a bias feed-forward transfer function and the bias RF power level, and (ii) a second compensation value based on a plasma feed-forward transfer function and the plasma RF power level;
a first summer configured to generate an error signal based on a set point temperature and the temperature of the substrate support;
a second controller configured to generate a control signal based on the error signal; and
a second summer configured to control an actuator to adjust the temperature of the substrate support based on the first compensation value, the second compensation value and the control signal.

2. The temperature controller of claim 1, wherein the compensation controller comprises:
a bias controller configured to multiply the bias RF power level by the bias feed-forward transfer function to provide the first compensation value; and
a plasma controller configured to multiply the plasma RF power level by the plasma feed-forward transfer function to provide the second compensation value.

3. The temperature controller of claim 1, wherein:
the compensation controller is configured to generate a third compensation signal based on a parameter feed-forward transfer function and a parameter; and
the second summer is configured to, based on the third compensation signal, control the actuator to adjust the temperature of the substrate support.

4. The temperature controller of claim 3, wherein the parameter is a pressure of a gas supplied to a processing chamber, a flow rate of a gas supplied to the processing chamber, a pressure of a coolant flowing through the substrate support, or a flow rate of a coolant flowing through the substrate support.

5. The temperature controller of claim 1, wherein at least one of the first interface or the second interface is an Ethernet for control automation technology (EtherCAT) interface.

6. The temperature controller of claim 1, wherein the first interface is an analog interface.

7. The temperature controller of claim 1, wherein the compensation controller is configured to estimate the temperature of the substrate support based on (i) a transfer function of the actuator, (ii) a bias RF disturbance transfer function, and (iii) a plasma RF disturbance transfer function.

8. The temperature controller of claim 7, further comprising a third summer configured to output the temperature of the substrate support based on (i) a product of an output of the second summer and the transfer function of the actuator, (ii) a product of the bias RF power level and the bias RF disturbance transfer function, and (iii) a product of the plasma RF power level and the plasma RF disturbance transfer function.

9. The temperature controller of claim 1, wherein the compensation controller is configured to (i) calibrate a bias gain and a plasma gain for each of multiple sub-steps of a step of a plasma process, (ii) generate the first compensation value based on the bias gain, and (iii) generate the second compensation value based on the plasma gain.

10. The temperature controller of claim 9, wherein the step is an etching step, a passivation step, a deposition step, or an ashing step.

11. A system for feed-forward temperature control, comprising:
the temperature controller of claim 1; and
a system controller configured to (i) receive the bias power signal and the plasma signal from a RF generating system via a third interface, and (ii) forward the bias power signal and the plasma signal to the temperature controller via a fourth interface.

12. The system of claim 11, wherein the first interface, the third interface and the fourth interface are Ethernet for control automation technology (EtherCAT) interfaces.

13. An inductive coupled plasma system comprising:
the temperature controller of claim 1;
the first RF generator;

the second RF generator;

the substrate support configured to receive RF power at the bias RF power level based on an output of the first RF generator; and an inductive coupling structure configured to receive RF power at the plasma RF power level based on an output of the second RF generator.

14. A capacitive coupled plasma system comprising:

the temperature controller of claim 1;

the first RF generator;

the second RF generator;

the substrate support configured to receive RF power at the bias RF power level based on an output of the first RF generator; and an electrode configured to receive RF power at the plasma RF power level based on an output of the second RF generator, wherein the electrode includes a showerhead.

* * * * *